United States Patent [19]

Brandt

[11] 3,765,076

[45] Oct. 16, 1973

[54] PRINTED CIRCUIT BOARD AND A METHOD OF REPAIRING CONTACTS ON A PRINTED CIRCUIT BOARD

[75] Inventor: Edmund D. Brandt, Chicago, Ill.

[73] Assignee: Western Electric Company, Incorporated, New York, N.Y.

[22] Filed: Nov. 16, 1971

[21] Appl. No.: 199,255

[52] U.S. Cl. .................................... 29/401, 29/625
[51] Int. Cl. ....... B23p 7/00, H05k 1/00, H05k 3/00
[58] Field of Search ...................... 29/401, 426, 625, 29/626; 174/68.5; 317/101 PC; 339/17 R

[56] References Cited

UNITED STATES PATENTS

| | | | |
|---|---|---|---|
| 3,180,018 | 4/1965 | Hougen | 29/401 |
| 3,256,589 | 6/1966 | Warren | 29/401 |
| 3,227,008 | 1/1966 | Celovsky | 29/401 |
| 3,354,542 | 11/1967 | Mallia | 29/625 |
| 3,376,630 | 4/1968 | Lempka | 29/401 |
| 3,681,841 | 8/1972 | LeBlanc et al. | 29/401 |
| 3,406,246 | 10/1968 | Davidson et al. | 29/625 |
| 2,877,544 | 3/1959 | Gammel | 29/401 |

OTHER PUBLICATIONS

Printed Wiring Boards, Part 4, PF Reporter, Nov. 1956, pages 36, 62–66.

*Primary Examiner*—Charles W. Lanham
*Assistant Examiner*—E. M. Combs
*Attorney*—W. M. Kain et al.

[57] ABSTRACT

A printed circuit board having at least one defective contact along an edge thereof is repaired by first cutting away the defective contact and a portion of the underlying board to form a slot therein, the removed contact being severed from an associated conductor and the portion of the board not removed forming a shelf at the bottom of the slot. Next, a contact assembly comprised of a replacement terminal carried on a section of insulating material and fabricated substantially similar in configuration to the terminal and board cut away, is secured on the shelf within the slot. The replacement terminal is then electrically connected with the associated conductor.

4 Claims, 4 Drawing Figures

Patented Oct. 16, 1973 3,765,076

2 Sheets-Sheet 1

PRINTED CIRCUIT BOARD AND A METHOD OF REPAIRING CONTACTS ON A PRINTED CIRCUIT BOARD

BACKGROUND OF THE INVENTION

1. Field of the Invention

The present invention relates to printed wiring boards and to a method for repairing the same, and in particular to a printed wiring board having a repaired contact thereon and to a method of repairing a contact on a printed wiring board.

2. Description of the Prior Art

Printed wiring boards are widely used in electronic apparatus, particularly as supports for electronic components. When used in such a capacity, the wiring boards are commonly referred to as printed circuit units or printed circuit boards. A typical printed circuit board comprises a wiring board, which is an insulating material with a plurality of conductors carried thereon, with numerous electronic components mounted on the wiring board and interconnected by the conductors. A plurality of contacts, usually along one edge of the printed circuit board, electrically connects with selected ones of the conductors and provides a means for interconnecting the circuit board with other apparatus, such as by insertion of the contact edge of the circuit board into a connector.

One commonly used printed circuit board is a copper-clad laminate upon which a desired conductor and contact pattern is formed by masking and etching techniques well known in the art. After the conductor and contact pattern have been formed in the copper layer, the board is masked while the contacts are given a thin gold plating for better wear, corrosion resistance, and conductivity characteristics. After the contacts have been gold plated, they are masked while components are mounted on the remainder of the board and the board is subsequently mass soldered. In view of the operations which must be performed thereon, and of the cost of the electronic components and gold plating added thereto, the circuit board as completed is relatively expensive.

Once the printed circuit board is completed, the contact area of the board is vulnerable to damage from subsequent handling, installation, and the like. Either the insulating material around or under the contacts may be fractured or otherwise damaged, or the gold contacts themselves may be damaged. Because of the thickness of the gold plating, usually one hundred millionths of an inch or less, the plating can be eaily scratched or otherwise damaged so as to expose the underlying copper. This creates an unacceptable situation because of potential corrosion, increased contact resistance, and increased contact wear.

Heretofore, efforts to repair damaged contacts have largely been unsuccessful because of the high cost of carrying out the strictly controlled procedures which must be utilized. Thus, the standard procedure has been to discard printed wiring boards having defective contacts, thereby resulting in substantial economic loss.

Accordingly, an object of the invention is to improve the procedure for repairing printed circuit units having defective contacts to make such procedures economically feasible.

SUMMARY OF THE INVENTION

In accordance with the present invention, a defective contact carried on a wiring board is repaired by removing the defective contact and a portion of the underlying board to form a cavity in the board, and by mounting in the cavity a replacement contact carried on a section of insulating material.

Preferably, the defective contact is along an edge of the board, and is both removed from the board and severed from an associated conductor on the board by machining away the contact and a portion of the underlying board to form a shelf along the edge of the board. A strip of material carrying a replacement contact is then bonded to the shelf with the contact positioned adjacent to the conductor from which the defective contact was severed. An electrical connection is then established between the contact and the conductor by bridging with a strip therebetween. Alternatively, the electrical connection may be established by positioning an end of the contact above the conductor and by electrically engaging the contact with the conductor.

Other objects, advantages and features of the invention will be apparent upon consideration of the following detailed description when taken in conjunction with the appended drawings.

DETAILED DESCRIPTION

Figure 1:
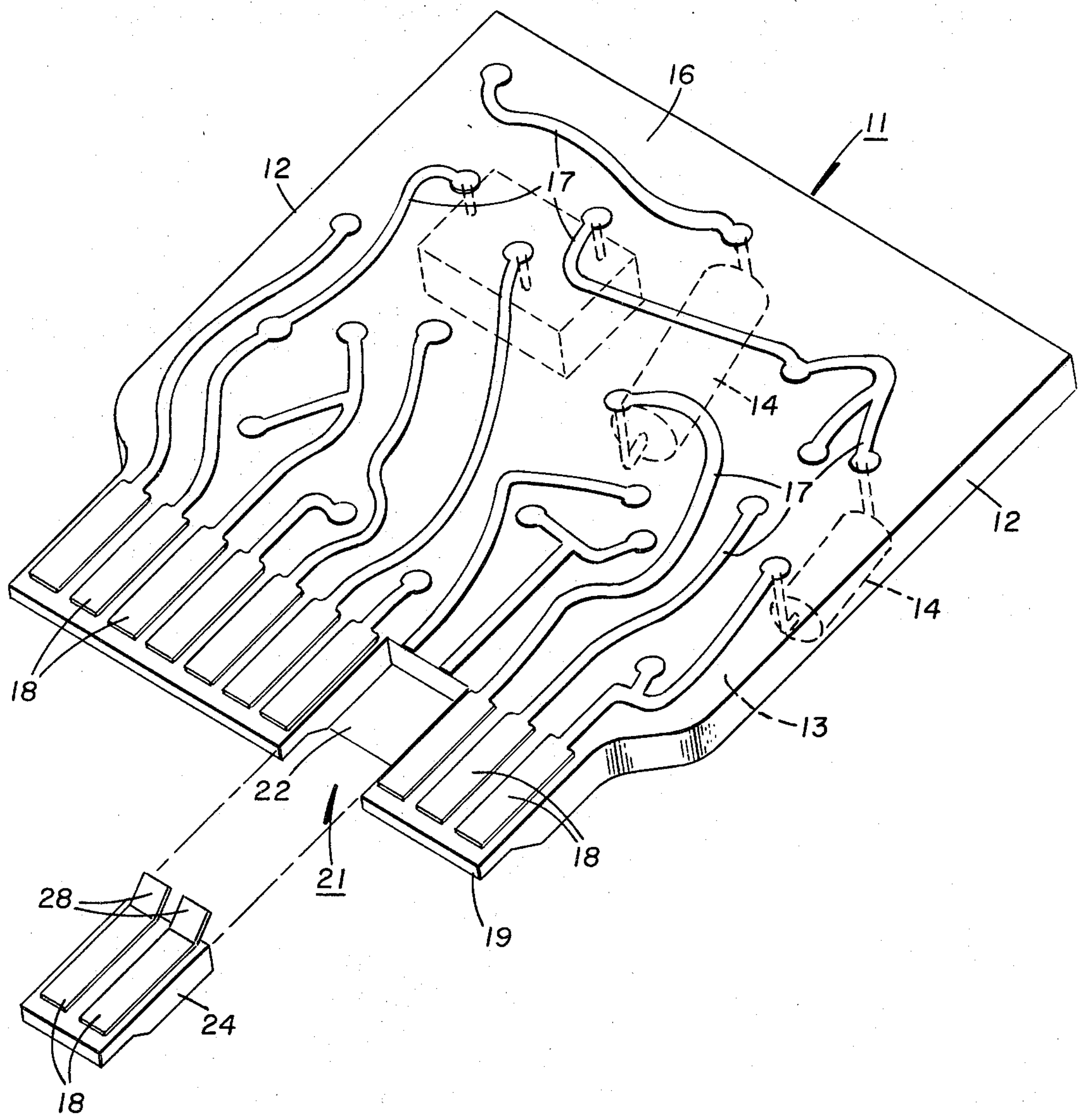
FIG. 1 is a perspective view of a printed circuit board having replacement contacts in accordance with the principle of the invention.

Referring to FIG. 1 of the drawings, there is shown a printed circuit unit or printed circuit board 11 comprised of a printed wiring board together with passive and/or active electrical components formed or mounted thereon. The printed wiring board as shown includes a sheet of insulating material 12 having a component side 13 for mounting components 14 and a conductor side 16 with a pattern of conductors or circuit paths 17 carried thereon. The sheet 12 may be formed from any suitable insulating material, such as phenolic, diallyl phthalate, or a thermo plastic known in the art. Conductive leads of the components 14 extend through the sheet of insulating material 12 to the conductor side 16 thereof, and are selectively interconnected by the circuit paths 17 both with themselves and with selected ones of a plurality of contacts or terminals 18 carried on an edge 19 of the printed wiring board 12. The contacts 18 are electrically engaged with other contacts on a connector (not shown) to interconnect the printed circuit unit with other apparatus (also not shown).

Figure 3:
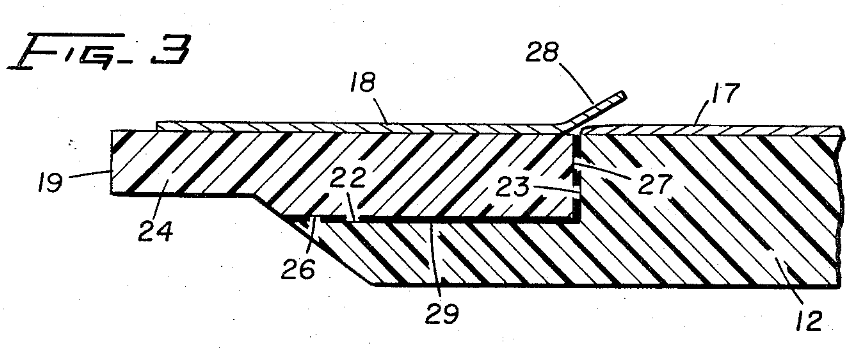
FIG. 3 is a section view taken along line 3—3 of FIG. 2, and shows the relationship of the replacement contacts to the wiring board.

Two contacts 18 which were determined to be defective for some reason, such as by virtue of their being scratched, have been severed from their associated conductors 17 and removed from along the edge 19 of the printed circuit board 11 by machining (e.g., milling or cutting) away the contacts and a portion of the underlying insulating material 12 to form a slot or cavity 21 in the printed circuit board. The conductors 17 which were severed from the defective contacts 18 terminate along an edge of the slot. Approximately one half of the thickness of the insulating material 12 is removed to form a step portion and to leave a shelf 22, formed from the remaining thickness of the insulating material 12, in the cavity 21. As best shown in FIG. 3, the shelf 22 is essentially horizontal and extends from a back wall 23 of the cavity 21 toward the edge 19 of the circuit board 11. Alternatively, the shelf 22 may be tapered to have a downward slope extending from the back wall 23 toward the edge 19 to alleviate stress concentrations.

Figure 2:
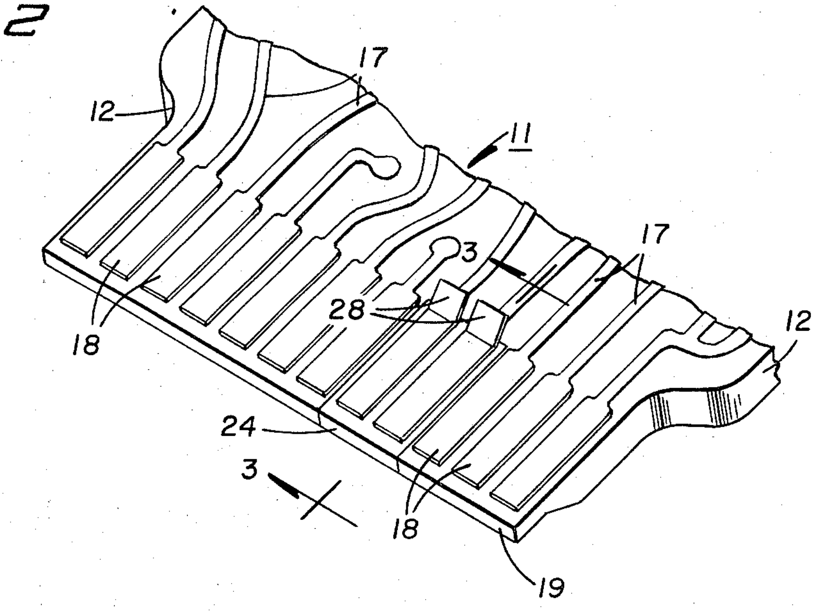
FIG. 2 is a view of the contact area of the wiring board of FIG. 1, showing the replacement contacts mounted thereon.

As shown in FIGS. 1 and 2, a contact assembly for replacing the two defective terminals and underlying board machined away is comprised of two replacement terminals 18 carried on a section or insert of insulating material 24, and is mounted on the shelf 22 of the cavity 21. The contact assembly is advantageously fabricated substantially similar in configuration to the terminals and underlying material removed from the sheet of insulating material 12 to form the cavity 21, and has a bottom 26 and an end 27 formed to match the shelf 22 and the back wall 23. Each replacement terminal 18 on the section of insulating material 24 has an extension 28 at one end thereof which projects beyond the edge of the section of material 24 corresponding to the edge of the slot along which the conductors 17 terminate. The replacement contact assembly may be fabricated from other defective boards with good contacts or from a specially prepared plastic strip having terminals extending thereacross. In any event, the contact assembly is formed with essentially the same geometrical dimensions as the milled slot.

The material 24 carrying the replacement contacts 18 is preferably identical in composition with the sheet of insulating material 12 and is adhesively bonded within the cavity 21 and to the shelf 22, with any suitable adhesive 29, in such a manner that the top surfaces of the insulating material 24 and of the sheet of insulating material 12 are substantially coplanar, and so that each replacement contact 18 is positioned adjacent and in alignment with, and with its extended end 28 overlying, an associated selected one of the conductors 17. The conductors 17 normally have a solder coating carried thereon, and the overlying ends 28 of the terminals 18 may be connected therewith by pressing the ends 28 into engagement with the conductors 17 with a heated soldering iron.

Figure 4:
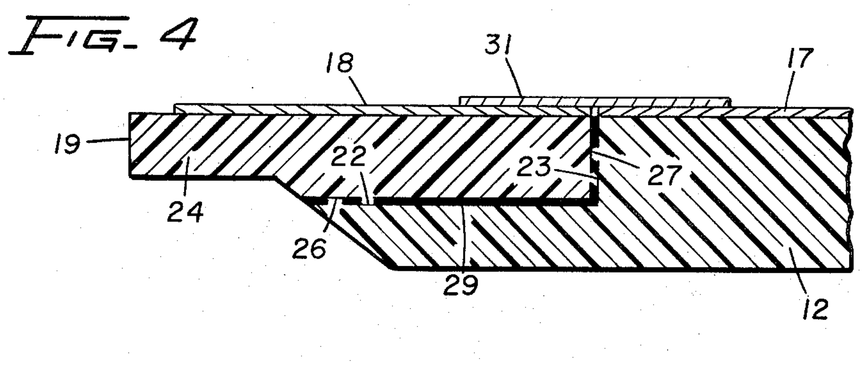
FIG. 4 is similar to FIG. 3, and shows one method of connecting a replacement contact to a conductor on the wiring board.

Alternatively, as shown in FIG. 4 of the drawings, an electrical connection may be established between each replacement contact 18 and its associated conductor 17 with a conductive overlay or bridge 31. In this case, the extending end 28 of each replacement terminal 18 is eliminated, so that when the thickness of insulating material 24 is mounted on the shelf 22 the end of each replacement terminal 18 abuts, but does not overlap, its associated conductor 17 carried on the sheet of insulating material 12. A bridge 31 is then positioned and soldered across each replacement contact 18 and its associated conductor 17.

With the replacement terminals mounted on the shelf 22 in the cavity 21 which was formed by the removal of the original defective terminals, the contact end 19 of the repaired printed circuit board 11 has a configuration substantially identical with the configuration of the board as it was prior to the removal of the defective terminals, and is suitable for insertion into a connector to interconnect the printed circuit board 11 with other apparatus.

While one particular embodiment of the invention has been described in detail, it is understood that various other modifications and embodiments may be devised by one skilled in the art without departing from the spirit and scope of the invention. For example, while the invention has been described in terms of replacing two adjacent defective terminals, a single terminal, or more than two terminals, could similarly be replaced. And it is not necessary that the defective terminals be adjacent, as two or more separate and distinct cavities for accepting replacement terminals may be machined in the circuit board.

What is claimed is:

1. A method of repairing a wiring board having a circuit path thereon connected with a defective terminal along one edge thereof, which comprises:

cutting away the terminal and an underlying portion of the board to a depth which is less than the total thickness of the board to form a slot and a bottom shelf and to sever the terminal from the circuit path, the circuit path terminating at an edge of the slot;

fabricating a section of insulating material with a replacement terminal carried thereon, the section being fabricated to correspond in area and thickness to the area and depth of the slot;

placing the section of insulating material in the slot to rest on the bottom shelf with the replacement terminal adjacent to the end of the circuit path; and electrically connecting the replacement terminal with the circuit path.

2. The method as recited in claim 1, wherein the electrically connecting step comprises soldering a conductive bridge between the replacement terminal and the circuit path.

3. A method of replacing a plurality of adjacent defective contacts carried along an edge of a printed wiring board, the defective contacts each being connected to an associated circuit path on the wiring board, which comprises:

machining away the defective contacts and a portion of the underlying board to sever the defective contacts from their associated circuit paths and to form a cavity in the board, the underlying portion of the board not machined away forming a shelf and the circuit paths terminating at an edge of the cavity;

fabricating a contact assembly from a section of insulating material and a plurality of replacement contacts equal in number to the number of defective contacts machined away, the contact assembly conforming in configuration to the defective contacts and underlying board which were machined away;

mounting the contact assembly on the shelf in the cavity to position a different replacement contact adjacent to each circuit path terminating at the edge of the cavity; and electrically connecting each replacement contact with its adjacent circuit path.

4. In a method of repairing a circuit board having a conductive circuit path on a surface thereof extending toward one edge of the board, and a defective conductive terminal running from the circuit path toward the edge of the board, which comprises:

milling the defective terminal and a section of the underlying circuit board to remove the defective terminal and to form a slot running from the edge to the end of the circuit path, the slot extending downward from the surface to a depth which is less than sufficient to extend through the circuit board;

forming an insert having a configuration corresponding to the configuration of the milled section of the board and having a terminal corresponding to the milled terminal, the terminal having a lip extending from one end of the insert;

mounting the insert in the slot with the lip of the terminal positioned above the end of the circuit path, and electrically securing the lip of the terminal to the underlying conductor.

* * * * *

UNITED STATES PATENT OFFICE
CERTIFICATE OF CORRECTION

Patent No. 3,765,076 Dated October 16, 1973

Inventor(s) E. D. Brandt

It is certified that error appears in the above-identified patent and that said Letters Patent are hereby corrected as shown below:

The title should read --A METHOD OF REPAIRING CONTACTS ON A PRINTED CIRCUIT BOARD--. Column 1, lines 7-8, delete "to printed wiring boards and". Column 1, line 8, delete "the same" and insert in place thereof --printed wiring boards--. Column 1, lines 9-10, delete "to a printed wiring board having a repaired contact thereon and". Column 1, line 52, "eaily" should read --easily--. Column 2, lines 3-8, delete in their entirety. Column 2, line 9, delete "Preferably, the" and insert in place thereof --In accordance with the present invention, a--. Column 2, line 9, after "contact" delete "is". Column 2, line 10, before "board" first occurrence, delete "the" and insert in place thereof --a wiring--. Column 2, line 10, after "board" first occurrence, delete ", and".

Signed and sealed this 23rd day of July 1974.

(SEAL)
Attest:

McCOY M. GIBSON, JR.
Attesting Officer

C. MARSHALL DANN
Commissioner of Patents